United States Patent
Masui et al.

(10) Patent No.: US 7,767,475 B2
(45) Date of Patent: Aug. 3, 2010

(54) LIGHT EMITTING DEVICE

(75) Inventors: Mikio Masui, Kashihara (JP); Youji Urano, Ikeda (JP)

(73) Assignee: Panasonic Electric Works Co., Ltd., Osaka (JP)

(*) Notice: Subject to any disclaimer, the term of this patent is extended or adjusted under 35 U.S.C. 154(b) by 69 days.

(21) Appl. No.: 12/094,143

(22) PCT Filed: Dec. 28, 2005

(86) PCT No.: PCT/JP2005/024032
§ 371 (c)(1),
(2), (4) Date: May 16, 2008

(87) PCT Pub. No.: WO2007/057983
PCT Pub. Date: May 24, 2007

(65) Prior Publication Data
US 2008/0258164 A1 Oct. 23, 2008

(30) Foreign Application Priority Data
Nov. 21, 2005 (JP) ............................. 2005-336190

(51) Int. Cl.
*H01L 33/00* (2010.01)
*H01L 21/00* (2010.01)
(52) U.S. Cl. .................... 438/26; 257/98; 257/E33.068; 257/E33.055; 257/E21.499; 438/27
(58) Field of Classification Search .................... 257/98, 257/99, E33.068, E33.055, E33.056, E21.499; 438/26, 27; 362/235
See application file for complete search history.

(56) References Cited
U.S. PATENT DOCUMENTS
2004/0169466 A1 9/2004 Suehiro et al.
(Continued)

FOREIGN PATENT DOCUMENTS
JP 63-293584 A 11/1988
(Continued)

OTHER PUBLICATIONS
International Search Report for the Application No. PCT/JP2005/024032 mailed Mar. 14, 2006.
(Continued)

Primary Examiner—Victor A Mandala
Assistant Examiner—Whitney Moore
(74) Attorney, Agent, or Firm—Cheng Law Group, PLLC

(57) ABSTRACT

Light emitting device 1 includes an LED chip 10, a mounting substrate 20 carrying the LED chip, a dome-shaped color conversion member 70, and encapsulation member 50. Color conversion member 70 is molded from a transparent resin material and a fluorescent material which is excited by a light emitted from the LED chip to emit a light of a color different from a luminescent color of the LED chip, and is bonded to the mounting substrate to surround LED chip 10. Encapsulation member 50 is made of an encapsulation resin material to encapsulate LED chip 10 and bonding wires 14 within a space confined between mounting board 20 and color conversion member 70. Encapsulation member 50 is of a convex-shape to have its light output surface 50b kept in an intimate contact with an internal surface of color conversion member 70. Since the intimate contact between the convex-lens shaped encapsulation member 50 and the color conversion member is made without the use of a conventional frame, the light emitting device can restrain the generation of voids in the encapsulation member, and therefore give improved reliability. Moreover, the light output efficiency is also improved.

2 Claims, 10 Drawing Sheets

U.S. PATENT DOCUMENTS

| | | | |
|---|---|---|---|
| 2005/0239227 A1 | 10/2005 | Aanegola et al. | |
| 2006/0243995 A1* | 11/2006 | Hong et al. | 257/98 |
| 2009/0026485 A1* | 1/2009 | Urano et al. | 257/99 |
| 2009/0267093 A1* | 10/2009 | Kamada et al. | 257/98 |

FOREIGN PATENT DOCUMENTS

| | | |
|---|---|---|
| JP | 2001-085748 A | 3/2001 |
| JP | 2001-148514 A | 5/2001 |
| JP | 2002-094122 A | 3/2002 |
| JP | 2003-110146 A | 4/2003 |
| JP | 2004-207660 A | 7/2004 |
| JP | 2005-079464 A | 3/2005 |
| JP | 2005-109282 A | 4/2005 |
| JP | 2005-123477 A | 5/2005 |
| JP | 2005-136224 A | 5/2005 |
| JP | 2005-159045 A | 6/2005 |
| JP | 3114129 U | 9/2005 |
| WO | WO-2004/077580 A2 | 9/2004 |

OTHER PUBLICATIONS

Notification of Reasons for Refusal for the Application No. 2005-336190 from Japan Patent Office, mailed Jan. 23, 2007.
The First Office Action for the Application No. 200580052120.5 from the State Intellectual Property Office of the People's Republic of China dated Jun. 5, 2009.

* cited by examiner

LIGHT EMITTING DEVICE

TECHNICAL FIELD

The invention relates to a light emitting device using a LED (Light Emitting Diode) chip and a manufacturing method thereof.

BACKGROUND ART

Japanese Unexamined Patent Application Publication No. 2001-85748 (hereinafter referred to as patent document 1) and Japanese Unexamined Patent Application Publication No. 2001-148514 (hereinafter referred to as patent document 2) propose a light emitting device which comprises a LED chip, a circuit board mounting the LED chip, a metal frame (e.g. made of aluminum) surrounding the LED chip on a surface of the circuit board, and an encapsulation member (e.g. made of an transparent resin such as an epoxy resin and a silicone resin) filled within the frame to encapsulate the LED chip and bonding wires connected to the LED chip. The frame disclosed in the Patent document 1 and 2 is shaped to have an opening area which becomes greater as it is spaced further away from the circuit board and is finished to have a mirror interior face which serves as a reflector reflecting a light emitted from the LED chip.

Further, the patent document 2 discloses the light emitting device which utilizes a blue LED chip with blue luminescence to radiate a white luminescent spectrum by use of a yellowish fluorescent material which is dispersed in a transparent resin encapsulating the blue LED chip to be excited by the light from the blue LED chip.

When an epoxy resin is used as a material of the encapsulation member in the light emitting device, bonding wires may be cut off when subjected to a heat cycle test (temperature cycle test) of repeating a low temperature period of −40° C. and a high temperature period of 80° C. alternately, due to thermal-expansion of an electrically conductive pattern mounted on a substrate of a circuit board in the high temperature environment.

On the other hand, when a silicone resin is used as a material of the encapsulation member in the light emitting device, the bonding wires can be prevented from being cut off in the high temperature period of the heat cycle test because of that the encapsulation member is gelatinous and elastic. However, since a linear expansion coefficient of the silicone resin, which is a material of the encapsulation member, is more than 10 times that of an aluminum which is a material of the frame, voids may be generated within the encapsulation member due to the difference in linear expansion coefficient between silicone resin and aluminum.

Furthermore, in the light emitting device, although the light emitted from the LED chip can be taken to external of the encapsulation member effectively by means of the frame finished with a mirror interior face, there is a failure of causing light loss resulting from the reflection of the light on the interior face of the frame.

Besides, in the light emitting device according to the Patent document 1, when a lens controlling an orientation of the light emitted from the LED chip is arranged over the encapsulation member and the frame, a light output may be lowered due to a deviation between an optical axis of the LED chip and that of the lens, resulting from dimensional accuracy or assembling accuracy of the frame and the lens.

The Patent document 2 also discloses a light emitting device in which the encapsulating member of the LED chip and the bonding wires connected thereto are configured to have its portion shaped into a convex lens. However, since the light emitting device utilizes a fluorescent material which is dispersed partially or entirely in the encapsulation member, its concentration is likely to vary from portions to portions in the encapsulation member, causing color ununiformity. Further, when the fluorescent material is dispersed entirely in the encapsulation member, an increased amount of the fluorescent material is necessary with an attendant cost increase. It is possible that a dome-shaped color conversion member is molded from a fluorescent material and a transparent resin material and is arranged to form an air layer around the encapsulation member. However, in this instance, the color conversion member has to be relatively large in size, and requires an increased amount of the fluorescent material. Further, the air layer between the conversion member and the encapsulation member may cause a total reflection at the interface between the encapsulation member and the air layer depending upon the shape of the encapsulation member, thereby reducing the light output.

DISCLOSURE OF THE INVENTION

In view of the above problem, the present invention has been accomplished and has an object of providing a light emitting device and a method of manufacturing the same capable of improving light output as well as its reliability and being manufactured at a reduced cost.

The light emitting device of the present invention includes a light emitting diode (LED) chip, a mounting substrate to which the LED chip is mounted, a dome-shaped color conversion member, and an encapsulation member. The color conversion member is molded from a transparent resin material and a fluorescent material which is excited by a light from the LED chip to emit a light of a color different from a luminescent color of the LED chip and is secured on the mounting substrate so as to surround the LED chip. The encapsulation member is made from an encapsulation resin material to encapsulate the LED chip within the space confined between the mounting substrate and the color conversion member. The feature of the invention resides in that the encapsulation member is shaped to have a convex lens with its light output surface which is held in intimate contact with an interior surface of the color conversion member.

Since the light emitting device of the present invention is configured to have the convex lens shaped encapsulation member which is held in intimate contact with the interior face of the color conversion member without requiring a conventional frame, the encapsulation member can be free from generating voids therein during a low temperature range in the heat cycle test to improve reliability. Furthermore, non-use of the conventional frame surrounding the LED chip can improve a light output of the device. Besides, the color conversion member can be reduced in size with an attendant cost reduction.

Preferably, the mounting substrate comprises a heat conductive plate made of a heat conductive material, and a dielectric substrate stacked on the heat conductive plate, the dielectric substrate being provided on its surface opposite to the heat conductive plate with a pair of lead patterns for electrical connection respectively with electrodes of the LED chip. The dielectric substrate has a through-opening inside of which the LED chip is mounted to the heat conductive plate with a planar sub-mount member interposed therebetween. The sub-mount member has a larger size than the LED chip and thermally couples the LED chip to the heat conductive plate in order to relieve a stress applied to the LED chip due to a difference in linear expansion coefficient between the LED chip and the heat conductive plate.

In this case, the sub-mount member acts to efficiently radiate a heat generated in the LED chips through the heat conductive plate, and relieve the stress applied to the LED chip due to the difference in linear expansion-coefficient between the LED chip and the heat conductive plate.

Preferably, the sub-mount member is designed to have a thickness such that a surface of the LED chip facing the sub-mount member is spaced from the heat conductive plate by a distance greater than that between the heat conductive plate and an edge of the color conversion member opposed to the mounting substrate.

In this instance, the light emitted from the lateral side of the LED chip can be prevented from leaking out through the juncture between the color conversion member and the mounting substrate.

Preferably, the color conversion member is shaped to have a spherical inner surface about the LED chip for intimate contact with the light output surface of the encapsulation member.

In this instance, the light emitted from the LED chip can advance the color conversion member only with a minimum variation in an optical path for restraining color ununiformity.

A method of manufacturing the light emitting device in accordance with the present invention is preferred to include the followings steps.
(a) the step of mounting the LED chip to the mounting substrate to couple the LED chip to the mounting substrate by means of bonding wires;
(b) the step of covering the LED chip and the bonding wires with an uncured first encapsulation resin material which becomes one part of the encapsulation member;
(c) the step of poring an uncured second encapsulation resin material, which is the same material as the first one and becomes the other part of the encapsulation member, inside the color conversion member, and positioning the color conversion member on the mounting substrate; and
(d) the step of curing each of the first and second encapsulation resin materials to form the encapsulation member.

With this method, the encapsulation member can hardly suffer from generation of voids in the manufacturing process.

Preferably, the color conversion member in the light emitting device of the present invention is formed with an injection port for pouring the encapsulation resin material into the space confined between the color conversion member and the mounting substrate, and also with a discharge port for discharging the excess of the encapsulation resin material.

Further, the method of manufacturing the light emitting device in the present invention may include the following steps.
(a) the step of mounting the LED chip to the mounting substrate to couple the LED chip to the mounting substrate by means of the bonding wires;
(b) the step of fixing the color conversion member on the mounting substrate carrying the LED chip thereto;
(c) the step of filling an uncured encapsulation resin material within the space confined between the color conversion member and the mounting substrate through the injection port of the color conversion member;
(d) the step of curing the encapsulation resin material to form the encapsulation member.

Also with this method, the encapsulation member can hardly suffer from generation of the voids in the manufacturing process.

Besides, the method of manufacturing the light emitting device in accordance with the present invention may include the following steps.
(a) the step of mounting the LED chip to the mounting substrate to couple the LED chip to the mounting substrate by means of the bonding wires;
(b) the step of covering the LED chip and the bonding wire with the uncured first encapsulation resin material which becomes one part of the encapsulation member;
(c) the step of fixing the color conversion member on the mounting substrate after the step (b);
(d) the step of filling the uncured second encapsulation resin material, which is the same material as the first one and becomes the other part of the encapsulation member, within the space confined between the color conversion member and the mounting substrate through the injection port of the color conversion member;
(e) the step of curing the first and second encapsulation resin materials to form the encapsulation member.

Also with this method, the encapsulation member can hardly suffer from generation of the voids in the manufacturing process.

BEST MODE FOR CARRYING OUT THE INVENTION

Hereafter, the invention will be explained in detail with reference to the attached drawings.

FIRST EMBODIMENT

Figure 1:
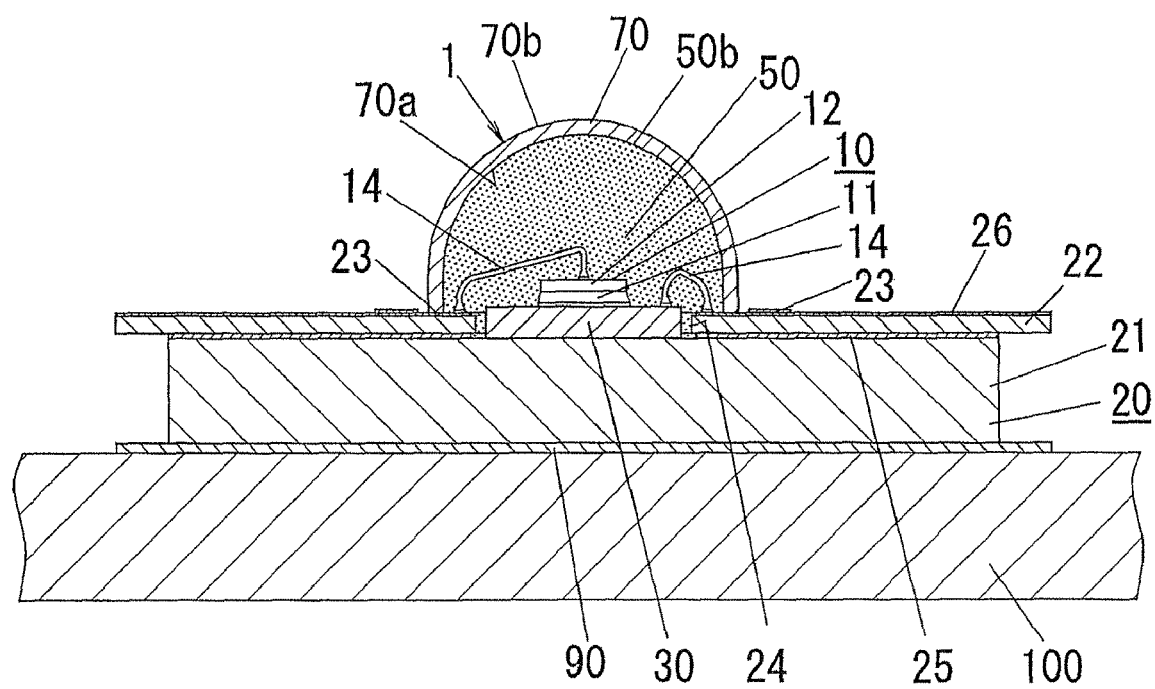
FIG. 1 is a cross sectional view of a light emitting device in accordance with a first embodiment.
Figure 2:
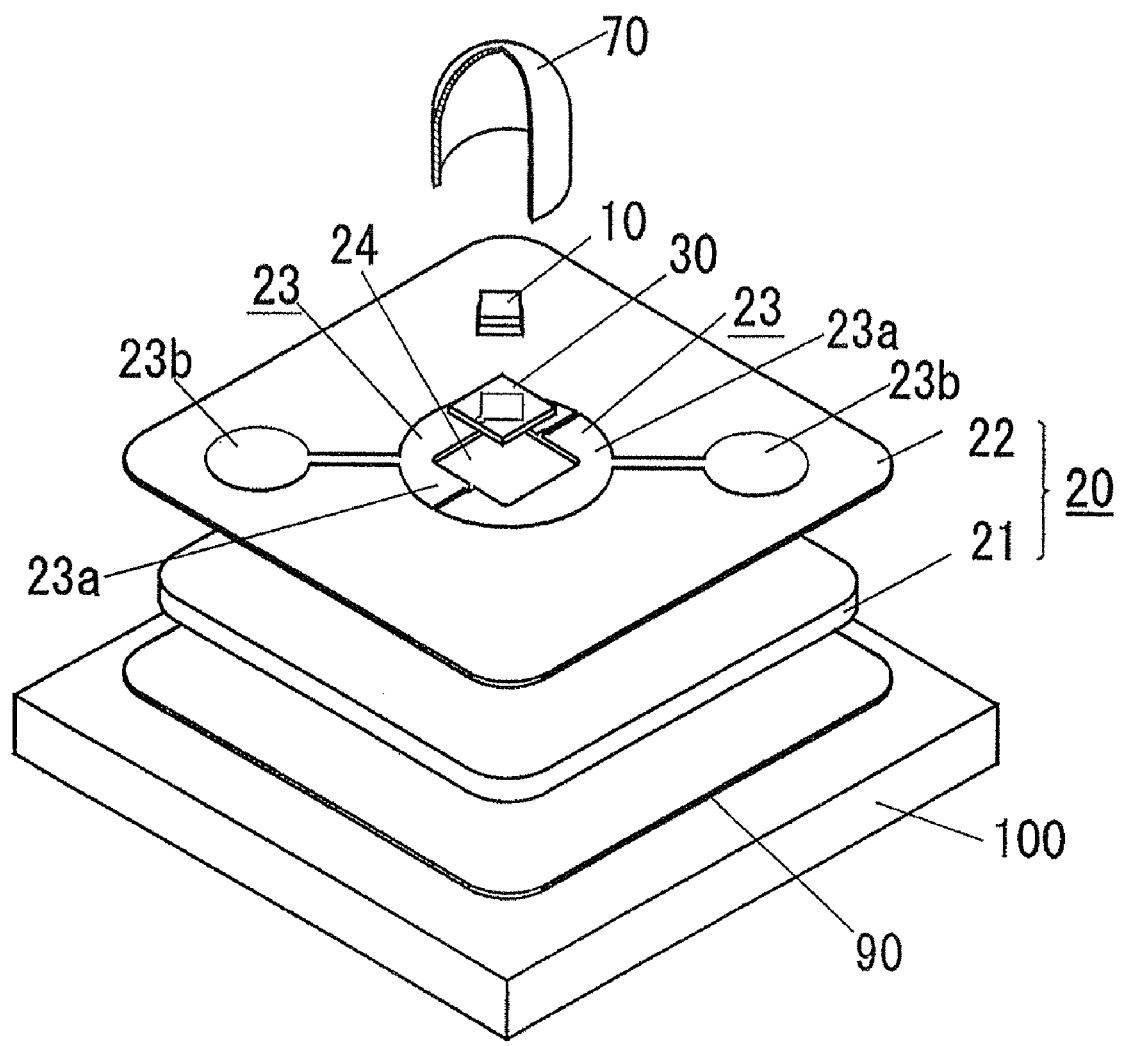
FIG. 2 is an exploded perspective view of the above light emitting device with a portion broken away.
Figure 3:
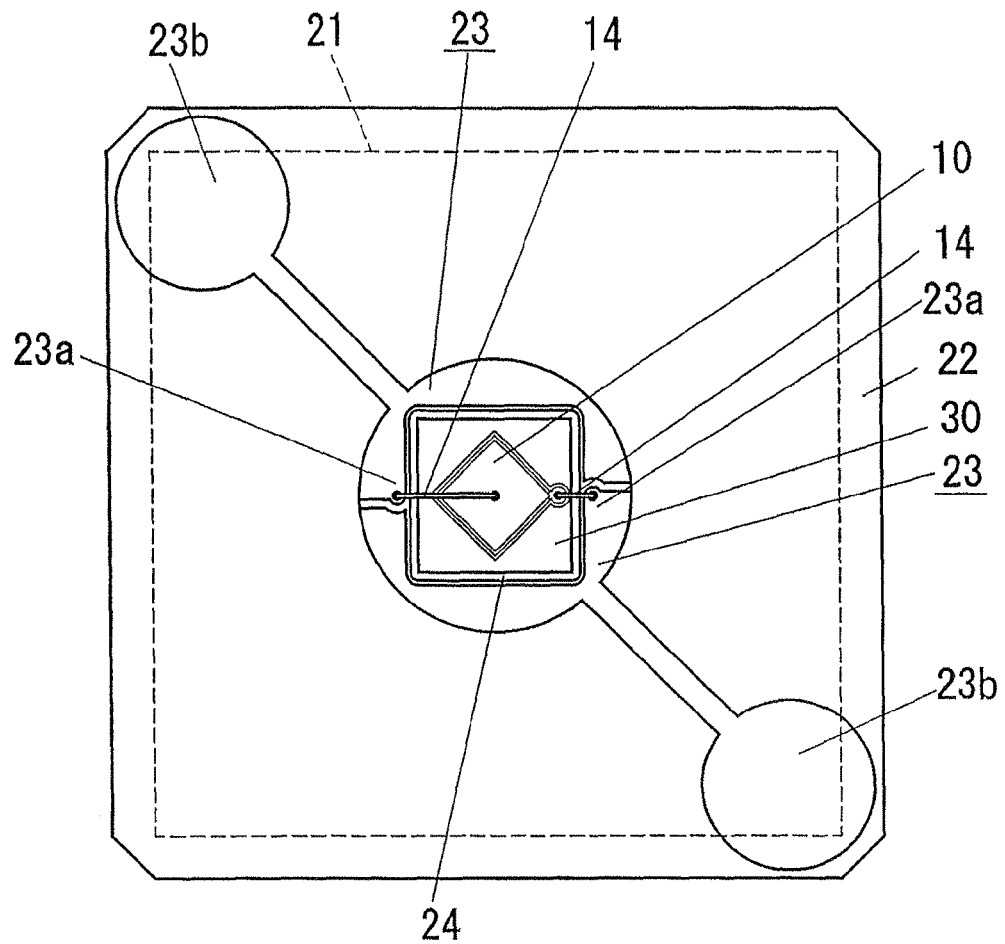
FIG. 3 is a plan view of an essential part of the above light emitting device.

As shown in FIGS. 1 to 3, the light emitting device 1 of the present embodiment includes an LED chip 10, a mounting substrate 20 to which the LED chip is mounted, a dome-shaped color conversion member 70, and an encapsulation member 50. The color conversion member 70 is molded from a transparent resin material, and a fluorescent material which is excited by a light from LED chip 10 to emit a light of a color different from a luminescent color of the LED chip 10. The color conversion member 70 is fixed on the mounting substrate 20 to surround the LED chip 10 and individual bonding wires 14 connected to the LED chip 10. The encapsulation member 50 is made from an elastic encapsulation resin material to encapsulate the LED chip 10 and the bonding wires 14 within the space confined between the mounting substrate 20 and the color conversion member 70. The encapsulation member 50 is configured to have a convex lens shape with a light output surface 50b which is held in an intimate contact with an interior surface of the color conversion member 70.

The light emitting device 1 of the present embodiment is adapted in use, for example, as a light source of an illumination appliance, and is mounted to a metal body 100 of the appliance (e.g. the metal with a high thermal conductivity such as Al, Cu) through a dielectric layer 90 made of, for example, a green sheet. As being mounted to the metal body 100 of the appliance, a thermal resistance from the LED chip 10 to the metal body 100 can be lowered to improve heat-dissipation capability. Further, since a temperature rise at a junction of the LED chip 10 can be restrained, an increased input power is available to give a high light output. It is noted in this connection that, when the light emitting device 1 is used for the illumination appliance, a plurality of the light emitting devices 1 may be mounted to the metal body 100 of the appliance in order to obtain an intended output light power with the emitting devices being connected in series or parallel with each other.

Figure 5A:
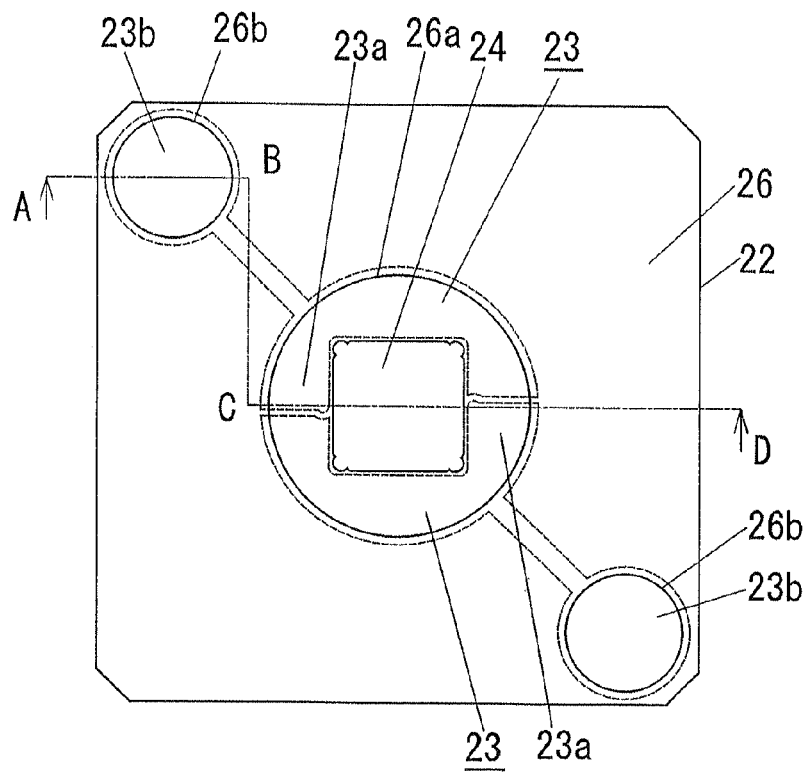
FIG. 5A is a plan view of a dielectric substrate utilized in the above light emitting device.
Figure 5B:
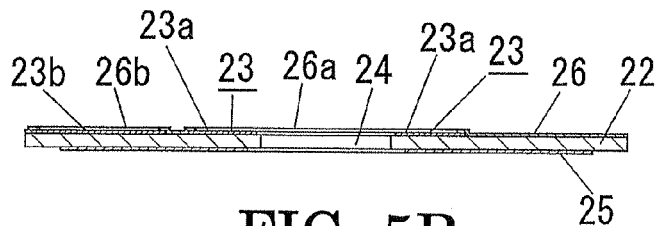
FIG. 5B is a cross sectional view of the above dielectric substrate taken along line A-B-C-D in FIG. 5A.
Figure 5C:
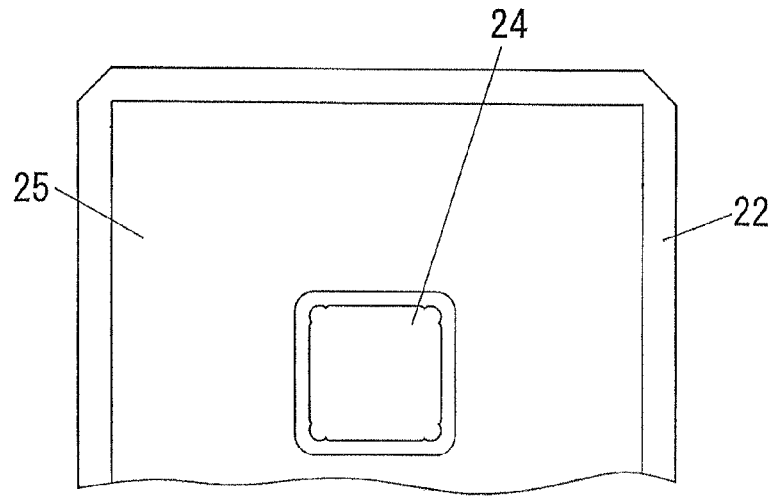
FIG. 5C is a partly broken away bottom view of the above dielectric substrate of FIG. 5A.

The mounting substrate 20 includes a metal plate (heat conductive plate) 21 made of a thermal-conductive material and a dielectric substrate 22 made of a glass epoxy (FR4) board and superimposed on the metal plate 21. Although the metal plate 21 is made of Cu in the present embodiment, it may be made of another metal having a relatively high thermal conductivity such as Al. The metal plate 21 is secured to the dielectric substrate 22 by means of a conjugative metal layer 25 (see, FIG. 1 and FIG. 5B, FIG. 5C.) which is made of a metallic material (in this embodiment, Cu) deposited on the surface of the dielectric substrate 22 opposed to the metal plate 21.

The dielectric substrate 22 includes a pair of lead pattern 23 coupled electrically to both electrodes (not shown) on a surface the LED chip 10 opposed to the metal plate 21, and is formed with a through-opening 24 at a position corresponding to the LED chip 10.

The LED chip 10 is mounted to the metal plate 21 through a planar sub-mount member 30 disposed within the through-opening 24. The sub-mount member 30 is shaped into a rectangular plate which is dimensioned to be larger than the LED chip 10, and thermally couples the LED chip 10 to the metal plate 21 in order to relieve a stress applied to the LED chip 10 due to a difference in linear expansion coefficient between the LED chip and the metal plate 21. A heat generated in the LED chip 10 is transmitted to the metal plate 21 not through the dielectric substrate 22. The sub-mount member 30 has a thermal conductive performance so as to radiate the heat generated in the LED chip 10 to the metal plate 21 over a wider area than the chip size of the LED chip 10. Since the LED chip 10 is thus mounted to the metal plate 21 through the sub-mount member 30 in the present embodiment, the heat generated in the LED chip 10 can be radiated efficiently through the sub-mount member 30 and the metal plate 21, while it is made to relieve the stress applied to the LED chip 10 due to the difference in linear expansion coefficient between the LED chip 10 and the metal plate 21.

In the embodiment, although AlN is adopted as a material of the sub-mount member 30 because of its relatively high thermal conductivity and insulating performance, the material of the sub-mount member 30 is not limited to AlN, and may be one (e.g. composite SiC, Si, or and the like) having the linear thermal expansion coefficient relatively close to that of an electrically-conductive substrate 11 made of 6H—SiC, and relatively high thermal conductivity.

Further, the sub-mount member 30 includes a reflecting film (e.g. laminate of Ni film and Ag film) formed around the conductive pattern 31 to reflect the light emitted from the LED chip 10.

Each lead pattern 23 is provided as a laminate of Cu film, Ni film, and Ag film. A resist layer 26 (see FIG. 1 and FIG. 5A, FIG. 5B) made from a whitish resin is superimposed on a surface of the dielectric substrate 22 away from the metal plate 21 to cover each lead pattern 23. The resist layer 26 is formed in its center with a circular opening 26a at a center in order to expose inner leads 23a of each lead pattern 23, and at its corners respectively with circular openings 26b in order to expose outer leads 23b of each lead pattern 23.

Figure 4:
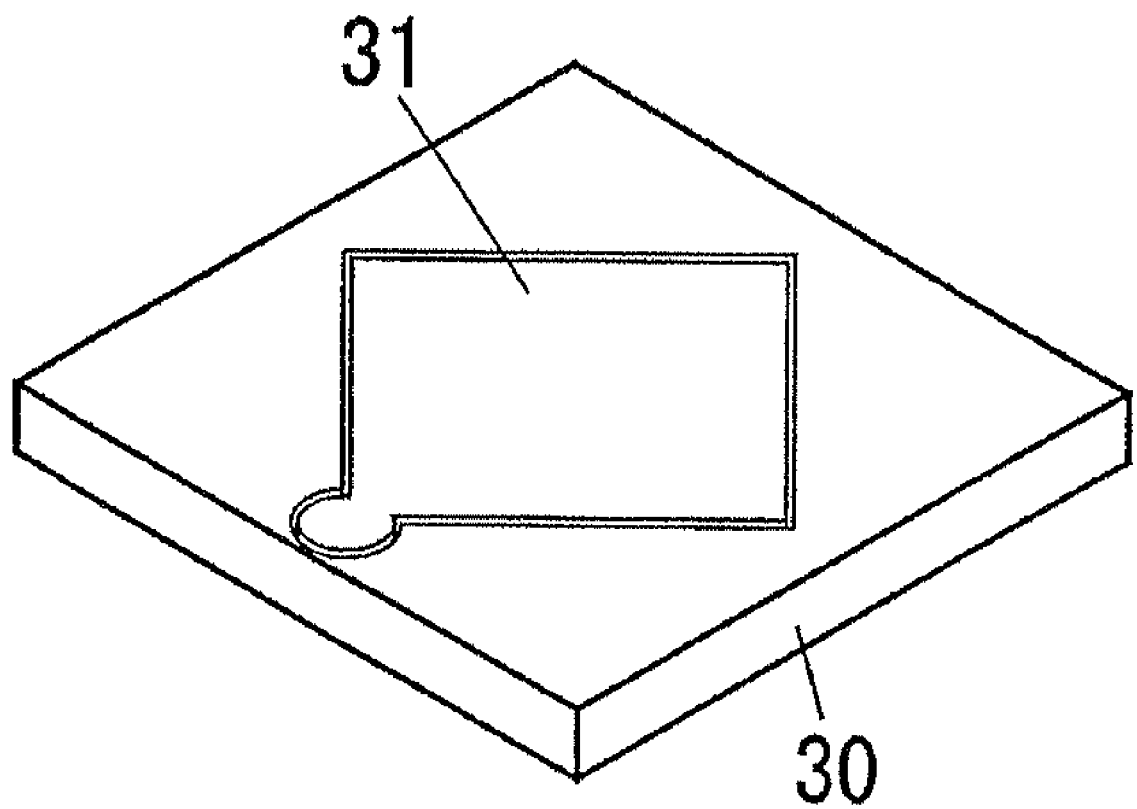
FIG. 4 is a perspective view of a sub-mount member utilized in the above light emitting device.

The LED chip 10 is a GaN-based blue LED chip emitting a blue light. The LED chip 10 includes the electrically conductive substrate 11 made of an electrically conductive n-type SiC having a lattice constant and a crystalline structure closer to those of GaN than sapphire. Formed on the main surface of the electrically conductive substrate 11 is a light emitting part 12 which is made of GaN-based semiconductor material and is obtained by an epitaxial growth (e.g. MOVPE process) to have a laminated structure, e.g. double-hetero structure. A cathode electrode (n-type electrode) (not shown) is formed on the rear side of the electrically conductive substrate 11 as an electrode on the side of the cathode. An anode electrode (p-type electrode) (not shown) is formed on the surface (a frontmost surface of the principle surface of the conductive substrate 11) of the light emitting part 12 as an electrode on the side of the anode. In short, the LED chip has the anode electrode on its one surface, and the cathode electrode on the other surface. The sub-mount member 30 has the conductive pattern 31 on a surface facing the LED chip 10 (as shown in FIG. 4). The LED chip 10 has the cathode electrode electrically contacted to one of the lead patterns 23 through the conductive pattern 31 and through the bonding wires 14 (e.g. gold thin wire, aluminum thin wire, and the like), and has the anode electrode electrically connected to the other lead pattern 23 through the bonding wires 14.

Although the cathode electrode and the anode electrode are each composed of the laminate of Ni film and Au film in the embodiment, materials of the cathode electrode and the anode electrodes are not particularly limited, and may be one having a good ohmic property (e.g. Al and the like). Further, the present embodiment illustrates that the LED chip 10 is mounted to the metal plate 21 with the light emitting part 12 of the LED chip 10 being spaced further away from the metal plate 21 by way of the sub-mount member 30 than the electrically conductive substrate 11. However, it is equally possible to mount the LED chip 10 to the metal plate 21 with the light emitting part 12 being closer to the metal plate 21 than the electrically conductive plate 11. Although it is desirable to space the light emitting part 12 away from the metal plate 21 from a viewpoint of optical extraction efficiency, the close disposition of the light emitting part 12 to the metal plate 21 does not increase the optical extraction loss because of that the electrically-conductive substrate 11 and the light emitting part 12 have the refractive index of the same level in the present embodiment.

It is noted in this connection that, although the LED chip 10 and the sub-mount member 30 can be joined by a solder such as SnPb, AuSn, SnAgCu, or a silver paste, they are preferably joined by use of a lead free solder such as AuSn, SnAgCu.

The encapsulation member 50 includes the light output surface 50b formed by one part of a spherical surface and is disposed to have a center of the spherical surface aligned with a center line of the light emitting part 12 extending through the LED chip 10 in a thickness direction thereof. In another words, the encapsulation member 50 is formed to have a lens of which optical axis is aligned with the center line of the light emitting part 12 extending through the center of the LED chip 10 in a thickness direction thereof. In the embodiment, the encapsulation member 50 may be made of an acrylic resin instead of the silicone resin.

The color conversion member 70 is molded from a mixture of the transparent resin material, e.g. silicone resin and a particulate yellowish fluorescent material which is excited by the blue light emitted from the LED chip 10 and passing through the encapsulation member 50 to radiate a broad-band yellowish white light. The color conversion member 70 is secured at its periphery to the mounting substrate 20 by an adhesive (e.g. silicone resin, epoxy resin), for example. The light emitting device 1 of the present embodiment can give off the white light which is a combination of the blue light emitted from the LED chip 10 and the light emitted through the yellowish fluorescent material, and radiated through an outer surface 70b of the color conversion member 70. The transparent resin material used for the color conversion member 70 is not limited to the silicone resin, but may include a material which has a higher refractive index than one of an encapsulation resin material used for the encapsulation member 50 and a linear expansion coefficient closer to that of the encapsulation resin material. When the acryl resin is used as the encapsulation resin material of the encapsulation member 50, it may be also employed as the transparent resin material of the color conversion member 70. Further, the fluorescent material mixed to the transparent resin material for the color conversion member 70 is not limited to the yellowish fluorescent material, and may be replaced with a mixture of a reddish fluorescent material and a greenish fluorescent material which gives a white light.

Preferably, the color conversion member 70 is configured to have its interior face 70a held in an intimate contact with the light output surface of the encapsulation member 50 and shaped into a spherical surface centered on the LED chip 10. In this instance, the difference in optical paths of the light emitting from the LED chip 10 towards various portions of the color conversion member 70 can be lowered to thereby reduce color ununiformity. Further, the color conversion member 70 is formed to have uniform thickness along a normal line for each circumferential point.

In order to prevent a leakage of the light emitted from the lateral side of the LED chip 10 through a juncture between the color conversion member 70 and the mounting substrate 20 (i.e., prevent the blue light from the LED chip 10 from radiating outwardly not through the color conversion member 70), it is preferred that the surface of the LED chip 10 facing the sub-mount member is spaced further away from the metal plate 21 than an edge of the color conversion member 70 adjacent to the mounting substrate is spaced from the metal plate 21. For this purpose, the present embodiment is configured to select the thickness of the sub-mount member 30 such that the surface of the LED chip 10 adjacent to the sub-mount member 30 is spaced further away from the metal plate 21 than the edge of the color conversion member 70. In more detail, the thickness of sub-mount member 30 is adjusted such that the bottom of the LED chip 10 is spaced away from the uppermost surface (a surface of the resist layer 26) of the mounting substrate 20 in a direction normal to the surface plane thereof.

Next, an explanation is made as to a method of manufacturing method the light emitting device 1 in accordance with the present invention.

Figure 6:
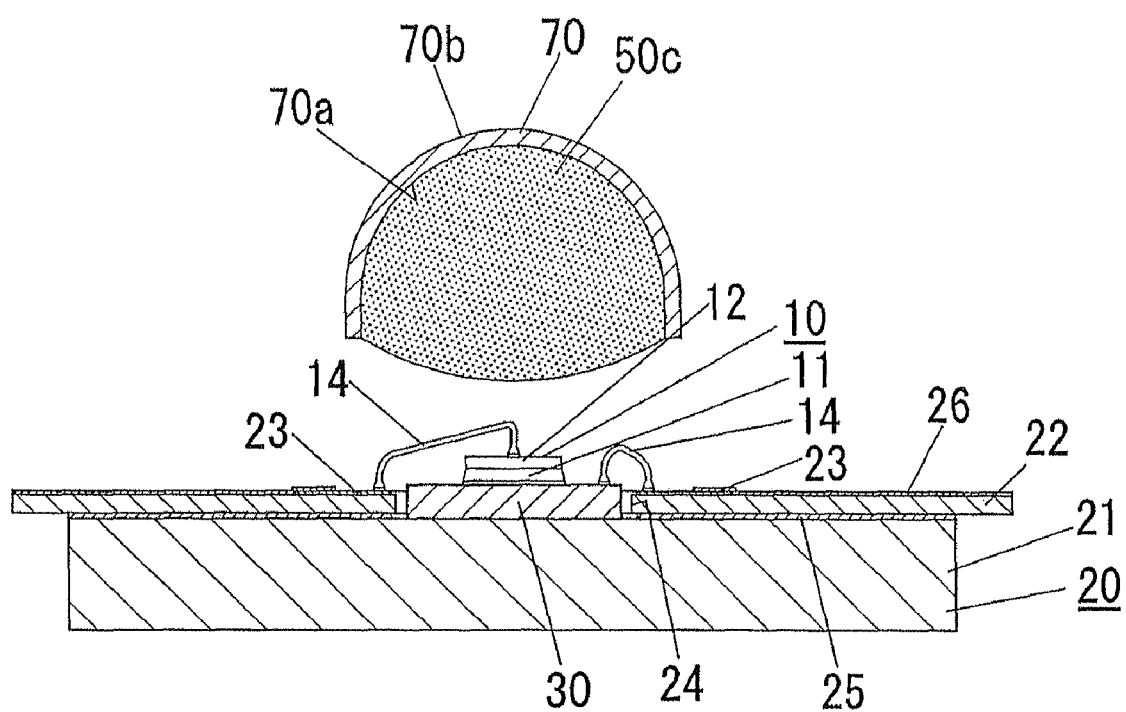
FIG. 6 is an explanation view illustrating a method of manufacturing the above light emitting device.

As shown in FIG. 6, the light emitting device could be manufactured by one method in which the LED chip 10 is firstly connected to the bonding wires 14, then the color conversion member 70 is filled in its inside with an uncured encapsulation resin material 50c (e.g. silicone resin) which forms the encapsulation member 50 later on, and subsequently the encapsulation resin material is cured to form the encapsulation member 50 with the color conversion member 70 held in position on the mounting substrate 20. However, such method would suffer from generating voids in the encapsulation member 50.

Figure 7:
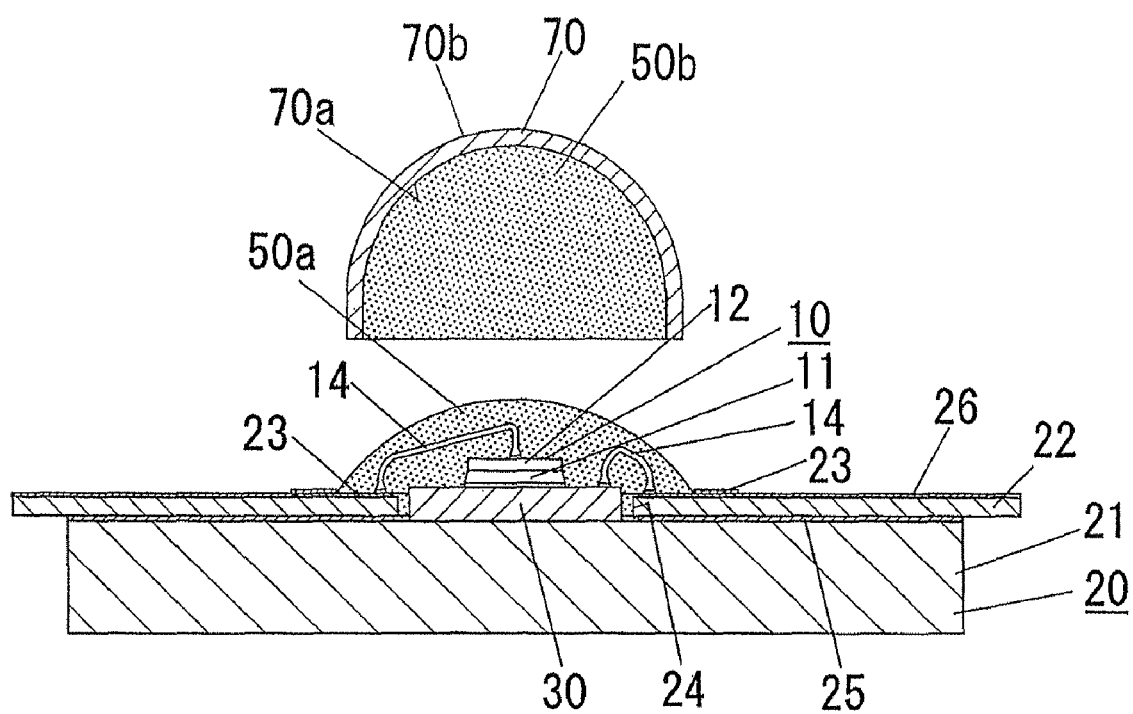
FIG. 7 is an explanation view illustrating a method of manufacturing the above light emitting device.

In view of this, the manufacturing method of the present embodiment is preferred to include the following steps. Firstly, the LED chip 10 is mounted to the mounting substrate 20 to be connected thereto by means of the bonding wires 14 (step (a)). Secondly, as shown in FIG. 7, the LED chip 10 and the bonding wires 14 are covered by an uncured first encapsulation resin material (for example, silicone resin) 50a which becomes one part of the encapsulation member 50 (step (b)). Next, an uncured second encapsulation resin material (for example, silicone resin) 50b, which is made of the same as the first encapsulation resin material 50a and becomes the other part of the encapsulation member 50, is injected into the color conversion member 70 followed by the color conversion member 70 being positioned on the mounting substrate 20 (step (c)). After that, each of the encapsulation resin materials 50a, 50b are cured to form the encapsulation member 50 (step (d)). This manufacturing method can reduce a possibility of generating the voids in the encapsulation member 50, and can provide the light emitting device 1 with a high reliability and a large light output.

In the present embodiment, the circular-shaped opening 26a formed in a center part of the resist layer 26 on the mounting substrate 20 is configured to have an inner diameter which is slightly larger than a maximum outer diameter of the color conversion member 70, and a portion of the first encapsulation resin material 50a flows into the interior of the opening 26a while being potted so as to be utilized as an adhesive for securing the color conversion member 70 to the mounting substrate 20.

As mentioned in the above, the light emitting device 1 of the present embodiment in configured to make the convex lens-shaped encapsulation member 50 in intimate contact with the interior face of the color conversion member 70 without relying upon a conventional frame. Accordingly, the device is given improved reliability as a consequence of eliminating generation of the voids in the encapsulation member in a low-temperature period of heat cycle test. Further, the device gives improved light output as a consequence of requiring no conventional frame. Moreover, the use of the small-sized color conversion member 70 can reduce the amount of the fluorescent material and therefore enable it to make the device at a low cost. Further, the encapsulation member 50 of the convex lens shape eliminates the use of an additional lens to thereby avoid the lowering of the light output due to the optical axis misalignment between the LED chip 10 and the lens, in addition to reducing the number of the components.

SECOND EMBODIMENT

The light emitting devices 1 of the present embodiment has a basic structure similar to the first embodiment, and therefore like parts are designated by like reference numerals and dispensed with duplicate explanations.

Figure 8:
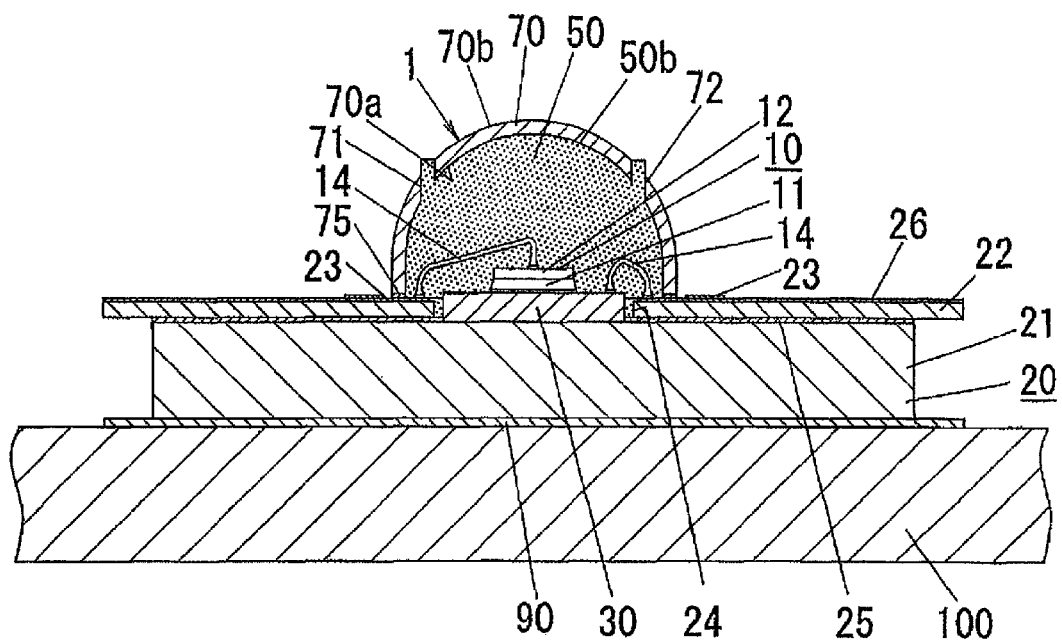
FIG. 8 is a cross sectional view of a light emitting device in accordance with a second embodiment.

In this embodiment, as shown in FIG. 8, the color conversion member 70 is formed with an injection port 71 for pouring an encapsulation resin material into the space confined between the color conversion member 70 and the mounting substrate 20, and also with a discharge port 72 for discharging the excess of the encapsulation resin material.

Further, the color conversion member 70 is bonded at its edge to the mounting substrate 20 by the juncture 75 made of an adhesive extending along the entire circumference of the edge. Thus, the light emitting device 1 of the present embodiment is easy to adjust the thickness of the juncture 75 between the color conversion member 70 and the mounting substrate 20 and is given improved reliability of bonding the color conversion member 70 to the mounting substrate 20, in comparison with the device of the first embodiment. In this instance, the adhesive of the juncture 75 is preferably the same material as the color conversion member 70.

Figure 9:
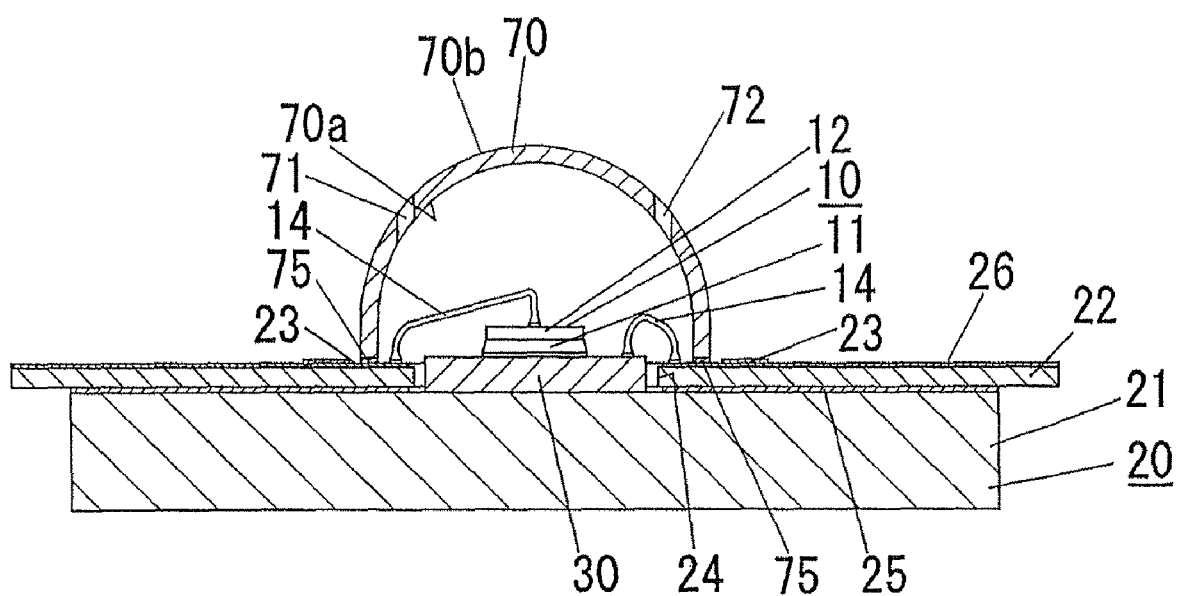
FIG. 9 is an explanation view illustrating a method of manufacturing the above light emitting device.

The light emitting device 1 of the present embodiment is preferred to be manufactured with the following steps. Firstly, the LED chip 10 is mounted to the mounting substrate 20, and the LED chip 10 is connected to the mounting substrate 20 by means of the bonding wires 14 (step (a)). Secondly, as shown in FIG. 9, the color conversion member 70 is adhered to the mounting substrate 20 at the juncture portion 75 (step (b)). Next, an uncured encapsulation resin material is filled within the space confined between the color conversion member 70 and the mounting substrate 20 through the injection port 71 of the color conversion member 70 (step (c)). After that, the encapsulation member 50 is formed by curing the encapsulation resin material (step (d)). With this manufacturing method, voids are hard to be generated in the encapsulation member 50 during the manufacturing process.

Figure 10A:
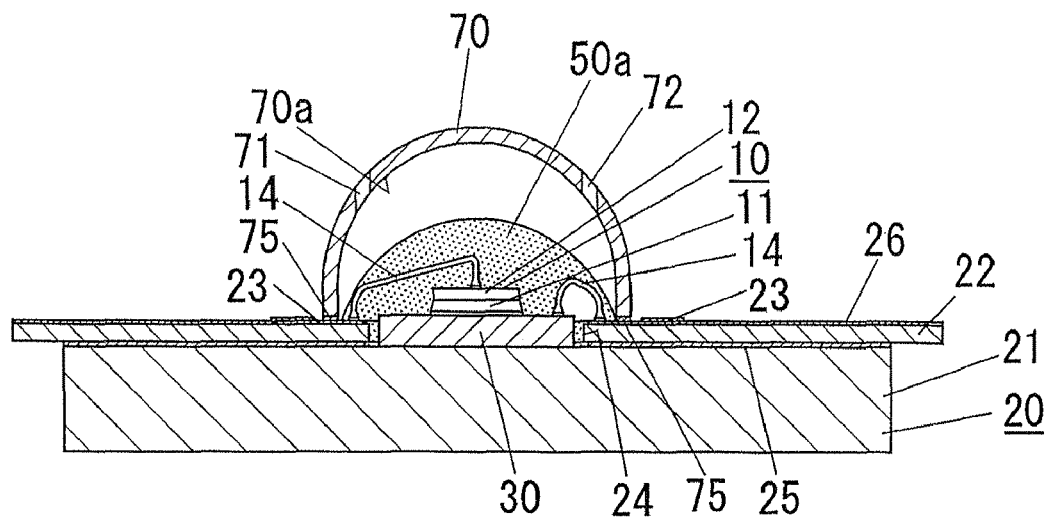
FIG. 10A is an explanation view illustrating a method of manufacturing the above light emitting device.
Figure 10B:
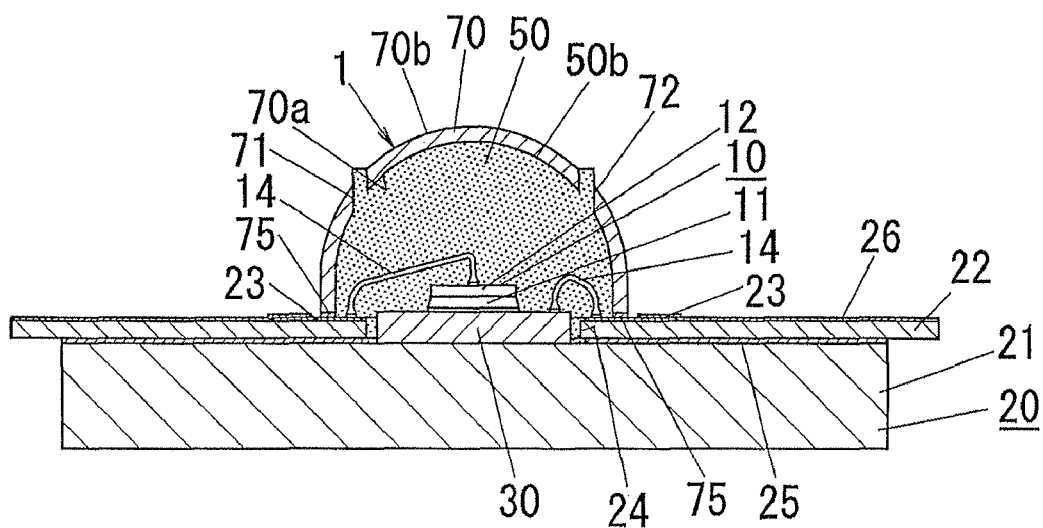
FIG. 10B is an explanation view illustrating a method of manufacturing the above light emitting device.

Further, the manufacturing method of the light emitting device 1 is preferred to include the following steps. Firstly, the LED chip 10 is mounted to the mounting substrate 20, and the LED chip 10 is connected to the mounting substrate 20 by means of the bonding wires 14 (step (a)). Secondly, as shown in FIG. 10A, the LED chip 10 and the bonding wires 14 are covered by the uncured first encapsulation resin material (e.g. silicone resin) 50a which becomes one part of the encapsulation member 50 (step (b)). After that, the color conversion member 70 is adhered to the mounting substrate 20 (step (c)). Next, the uncured second encapsulation resin material 50b, which is the same as the first encapsulation resin material 50a and becomes the other part of the encapsulation member 50, is filled within the space confined between the color conversion member 70 and the mounting substrate 20 through the injection port 71 of the color conversion member 70 (step (d)). Thereafter, the first encapsulation resin material 50a and the second encapsulation resin material are cured to form the encapsulation member 50 (step (e)). This instance has therefore an advantageous in that the encapsulation member 50 is made more reluctant to generate the voids.

Although each of the above embodiments employs the blue-light LED chip with the blue luminescence as the LED chip 10 and the SiC substrate as the electrically conductive substrate 11, a GaN substrate may be used instead of the SiC substrate. The use of the SiC substrate and the GaN substrate as an epitaxial growth substrate enables to increase thermal conductivity and lower the heat resistance thereof, in comparison with the use of a sapphire substrate as a dielectric epitaxial growth substrate. Further, the luminescent color of the LED chip 10 is not limited to be blue, and may be red, green or the like. Namely, a material of light emitting part 12 of the LED chip 10 is not limited to a compound of GaN-based semiconductor material, and may be selected from a compound of GaAs-based, GaP-based semiconductor materials, or the like, depending on the luminescent color of the LED chip 10. Besides, the electrically conductive substrate 11 is not limited to SiC substrate, and may be optionally selected from GaAs substrate, GaP substrate, and the like, depending on the material of light emission portion 12. Furthermore, it should not be noted that the sub-mount member 30 explained in each of the above embodiments is not necessarily provided in a circumstance where there is only a small difference of the linear expansion coefficient between the LED chip 10 and the mounting substrate 20. Moreover, the mounting substrate 20 may be configured differently from that explained in the each of the above embodiments.

As discussed in the above, apparently many widely different embodiments may be made without departing from the technical concept of the present invention, and therefore the present invention should not be limited to the specific embodiments except as defined in the claims.

The invention claimed is:

1. A method of manufacturing a light emitting device, said light emitting device comprising:

an LED chip, a mounting substrate mounting said LED chip;

a dome-shaped color conversion member made of a transparent resin material and a fluorescent material which is excited by a light emitted from said LED chip to emit a light of a color different from a luminescent color of the LED chip, said dome-shaped color conversion member being bonded on the mounting substrate to surround the LED chip, and an encapsulation member disposed in a space confined between the mounting substrate and the color conversion member to encapsulate the LED chip, said encapsulation member being made of an encapsulation resin material, wherein said encapsulation member has a convex lens-shape such that a light output surface of the encapsulation member is held in an intimate contact with an internal surface of the color conversion member, wherein said method comprises the steps of:

(a) mounting said LED chip to said mounting substrate, and connecting said LED chip to said mounting substrate by means of bonding wires;

(b) covering said LED chip and said bonding wires with an uncured first encapsulation resin material which becomes a part of said encapsulation member;

(c) filling up inside of said color conversion member with an uncured second encapsulation resin material which is the same material as said first encapsulation resin material and becomes the other part of said encapsulation member so as to position the color conversion member on the mounting substrate; and (d) curing at the same time each of said first and second uncured encapsulation resin materials to form said encapsulation member.

2. A method of manufacturing a light emitting device, said light emitting device comprising:
- an LED chip;
- a mounting substrate mounting said LED chip;
- a dome-shaped color conversion member made of a transparent resin material and a fluorescent material which is excited by a light emitted from said LED chip to emit a light of a color different from a luminescent color of the LED chip, said dome-shaped color conversion member being bonded on the mounting substrate to surround the LED chip, and
- an encapsulation member disposed in a space confined between the mounting substrate and the color conversion member to encapsulate the LED chip, said encapsulation member being made of an encapsulation resin material wherein said encapsulation member has a convex lens-shape such that a light output surface of the encapsulation member is held in an intimate contact with an internal surface of the color conversion member, and wherein said color conversion member has an injection port for injecting said encapsulation resin material into the space confined between the color conversion material and the mounting substrate and a discharge port for discharging an excess amount of said encapsulation resin material, wherein said method comprises the steps of:
(a) mounting said LED chip to said mounting substrate, and connecting said LED chip to said mounting substrate by means of bonding wires;
(b) covering said LED chip and said bonding wires with an uncured first encapsulation resin material which becomes a part of the encapsulation member;
(c) after the step of (b), bonding said color conversion member to said mounting substrate;
(d) filling up a space confined between said color conversion member and said mounting substrate with an uncured second encapsulation resin material, which is the same material as said first encapsulation resin material and becomes the other part of the encapsulation member, through said injection port of the color conversion member; and
(e) curing at the same time each of said first and second uncured encapsulation resin materials to form said encapsulation member.

* * * * *